US011837591B2

(12) United States Patent
Chen et al.

(10) Patent No.: US 11,837,591 B2
(45) Date of Patent: Dec. 5, 2023

(54) MANUFACTURING METHOD OF LIGHT EMITTING DIODE PACKAGE STRUCTURE

(71) Applicant: Unimicron Technology Corp., Taoyuan (TW)

(72) Inventors: Ming-Ru Chen, Hsinchu (TW); Tzyy-Jang Tseng, Taoyuan (TW); Cheng-Chung Lo, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/714,121

(22) Filed: Apr. 5, 2022

(65) Prior Publication Data

US 2022/0231004 A1 Jul. 21, 2022

Related U.S. Application Data

(62) Division of application No. 16/907,183, filed on Jun. 20, 2020, now Pat. No. 11,335,670.

(30) Foreign Application Priority Data

Apr. 21, 2020 (TW) .................. 109113363

(51) Int. Cl.
    *H01L 25/16* (2023.01)
    *H01L 33/62* (2010.01)
    *H01L 33/56* (2010.01)

(52) U.S. Cl.
    CPC ............ *H01L 25/167* (2013.01); *H01L 33/62* (2013.01); *H01L 33/56* (2013.01); *H01L 2933/0066* (2013.01)

(58) Field of Classification Search
    CPC ....... H01L 25/167; H01L 33/62; H01L 33/56; H01L 2933/0066
    See application file for complete search history.

(56) References Cited

U.S. PATENT DOCUMENTS

| 10,516,081 | B1 * | 12/2019 | Xin ........................ H01L 33/24 |
| 2010/0102344 | A1 * | 4/2010 | Ueji ..................... H01L 33/507 |
| | | | 257/E33.056 |
| 2015/0187740 | A1 * | 7/2015 | McGroddy ............. H01L 33/14 |
| | | | 345/82 |

(Continued)

FOREIGN PATENT DOCUMENTS

CN 110911541 * 3/2020 ........................ 33/62

OTHER PUBLICATIONS

"Office Action of China Counterpart Application", dated Jul. 29, 2022, p. 1-p. 7.

*Primary Examiner* — Victor A Mandala
(74) *Attorney, Agent, or Firm* — JCIPRNET

(57) ABSTRACT

A manufacturing method of a light emitting diode (LED) package structure includes the following steps. A carrier is provided. A redistribution layer is formed on the carrier. A plurality of active devices are formed on the carrier. A plurality of LEDs are transferred on the redistribution layer. The LEDs and the active devices are respectively electrically connected to the redistribution layer. The active devices are adapted to drive the LEDs, respectively. A molding compound is formed on the redistribution layer to encapsulate the LEDs. The carrier is removed to expose a bottom surface of the redistribution layer.

17 Claims, 21 Drawing Sheets

(56) References Cited

U.S. PATENT DOCUMENTS

| | | | |
|---|---|---|---|
| 2016/0307957 A1* | 10/2016 | A Tharumalingam | ........................ G01S 7/481 |
| 2019/0096864 A1* | 3/2019 | Huitema | ............. H01L 21/6835 |
| 2019/0181112 A1* | 6/2019 | Hu | ....................... H01L 23/5383 |
| 2020/0118989 A1* | 4/2020 | Wang | ....................... H01L 24/81 |
| 2020/0161518 A1* | 5/2020 | Lin | ..................... H01L 23/5389 |
| 2020/0211984 A1* | 7/2020 | Chuang | ............... H01L 23/5386 |

* cited by examiner

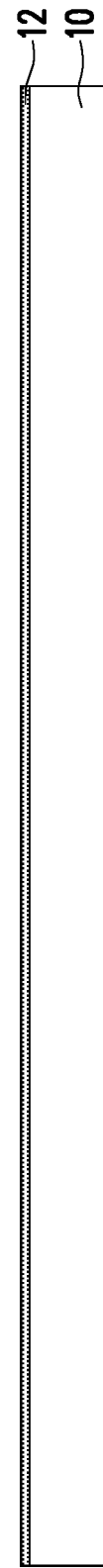

MANUFACTURING METHOD OF LIGHT EMITTING DIODE PACKAGE STRUCTURE

CROSS-REFERENCE TO RELATED APPLICATION

This application is a divisional application of and claims the priority benefit of U.S. patent application Ser. No. 16/907,183, filed on Jun. 20, 2020, now allowed. The prior application Ser. No. 16/907,183 claims the priority benefit of Taiwan application serial no. 109113363, filed on Apr. 21, 2020. The entirety of each of the above-mentioned patent applications is hereby incorporated by reference herein and made a part of specification.

BACKGROUND

1. Technical Field

The disclosure relates to a package structure and a manufacturing method thereof, and more particularly, to a light emitting diode (LED) package structure and a manufacturing method thereof.

2. Description of Related Art

At present, passive-matrix (PM) driving printed circuit board (PCB) backplanes are widely employed in large-scale micro light emitting diode (LED) displays. However, such PM driving PCB backplanes require a large number of driving chips, and therefore are expensive. Comparatively, in thin film transistor (TFT) backplanes according to the active matrix (AM) driving method, driving chips are integrated on the glass substrates. Although such AM driving TFT backplane costs less in price, it is difficult to manufacture a large-scale display driven by the AM driving TFT backplane since electronic devices cannot be soldered on the back surface of the glass substrate.

SUMMARY

The disclosure provides a light emitting diode (LED) package structure, which addresses the issue that electronic devices cannot be soldered on the back surface of a glass substrate. In addition, the LED package structure renders a lower cost.

The disclosure further provides a manufacturing method of the LED package structure. According to the manufacturing method, the manufacturing cost is low.

According to an embodiment of the disclosure, a manufacturing method of a light emitting diode (LED) package structure includes the following steps. A carrier is provided. A redistribution layer is formed on the carrier. A plurality of active devices are formed on the carrier. A plurality of LEDs are transferred onto the redistribution layer. The LEDs and the active devices are respectively electrically connected to the redistribution layer. The active devices are adapted to drive the LEDs, respectively. A molding compound is formed on the redistribution layer to encapsulate the LEDs. The carrier is removed to expose a bottom surface of the redistribution layer.

According to an embodiment of the disclosure, the redistribution layer is formed on the carrier before the plurality of active devices are formed on the carrier.

According to an embodiment of the disclosure, the carrier includes a release film, and the redistribution layer is located on the release film. When the carrier is removed, the release film is peeled off to separate the redistribution layer and the carrier.

According to an embodiment of the disclosure, the active devices and the LEDs are located on a side of the redistribution layer relatively away from the carrier.

According to an embodiment of the disclosure, each of the LEDs includes an active surface and a back surface opposite to each other, and the active surface is located between the back surface and the redistribution layer.

According to an embodiment of the disclosure, the manufacturing method further includes the following steps. Before the LEDs are transferred onto the redistribution layer, a dielectric layer is formed on the redistribution layer. The dielectric layer covers the active devices, and includes a plurality of openings to expose a portion of the redistribution layer. A surface treatment layer is formed in the openings, and directly contacts the redistribution layer.

According to an embodiment of the disclosure, each of the LEDs includes an active surface and a back surface opposite to each other, and the back surface is located between the active surface and the redistribution layer.

According to an embodiment of the disclosure, the manufacturing method further includes the following steps. Before the molding compound is formed on the redistribution layer, a dielectric layer is formed on the redistribution layer. The dielectric layer covers the active devices and the LEDs. The active surface of each of the LEDs is aligned to a surface of the dielectric layer. The dielectric layer includes a plurality of openings to expose a portion of the redistribution layer. A plurality of circuits are formed in the openings, and extend to the surface of the dielectric layer to connect the active surface of each of the LEDs.

According to an embodiment of the disclosure, the active devices are formed on the carrier before the redistribution layer is formed on the carrier.

According to an embodiment of the disclosure, the carrier includes a release film, and the active devices and the redistribution layer are located on the release film.

According to an embodiment of the disclosure, when the carrier is removed, the release film is peeled off to expose the bottom surface of the redistribution layer and surfaces of the active devices.

According to an embodiment of the disclosure, each of the LEDs includes an active surface and a back surface opposite to each other, and the active surface is located between the back surface and the redistribution layer.

According to an embodiment of the disclosure, before the LEDs are transferred onto the redistribution layer, a dielectric layer is formed on the redistribution layer. The dielectric layer includes a plurality of openings to expose a portion of the redistribution layer. A surface treatment layer is formed in the openings, and directly contacts the redistribution layer.

According to an embodiment of the disclosure, each of the LEDs includes an active surface and a back surface opposite to each other, and the back surface is located between the active surface and the redistribution layer.

According to an embodiment of the disclosure, the manufacturing method further includes the following steps. Before the molding compound is formed on the redistribution layer, a dielectric layer is formed on the redistribution layer. The dielectric layer covers the LEDs. The active surface of each of the LEDs is aligned to a surface of the dielectric layer. The dielectric layer includes a plurality of openings to expose a portion of the redistribution layer. A plurality of circuits are formed in the openings, and extend to the surface of the dielectric layer to connect the active surface of each of the LEDs.

According to an embodiment of the disclosure, the manufacturing method further includes the following step. After the molding compound is formed on the redistribution layer and before the carrier is removed, an optical base material is provided on a top surface of the molding compound.

According to an embodiment of the disclosure, the manufacturing method further includes the following step. After the carrier is removed to expose the bottom surface of the redistribution layer, a surface treatment layer is formed on the bottom surface of the redistribution layer.

According to an embodiment of the disclosure, an LED package structure includes a redistribution layer, a plurality of active devices, a plurality of LEDs and a molding compound. The active devices are disposed on the redistribution layer, and are electrically connected to the redistribution layer. The LEDs are disposed on the redistribution layer, and are electrically connected to the redistribution layer. The active devices are adapted to respectively drive the LEDs. The molding compound is disposed on the redistribution layer, and encapsulates the LEDs.

According to an embodiment of the disclosure, the redistribution layer includes a top surface and a bottom surface opposite to each other, and includes a first circuit structure adjacent to the top surface and a second circuit structure adjacent to the bottom surface.

According to an embodiment of the disclosure, the active devices and the LEDs are located on the first circuit structure.

According to an embodiment of the disclosure, each of the LEDs includes an active surface and a back surface opposite to each other, and the active surface is located between the back surface and the redistribution layer.

According to an embodiment of the disclosure, the LED package structure further includes a dielectric layer and a surface treatment layer. The dielectric layer is disposed on the redistribution layer. The dielectric layer covers the active devices, and includes a plurality of openings to expose a portion of the redistribution layer. The surface treatment layer is disposed in the openings, and directly contacts the redistribution layer.

According to an embodiment of the disclosure, each of the LEDs includes an active surface and a back surface opposite to each other, and the back surface is located between the active surface and the redistribution layer.

According to an embodiment of the disclosure, the LED package structure further includes a dielectric layer and a plurality of circuits. The dielectric layer is disposed on the redistribution layer, and covers the active devices and the LEDs. The active surface of each of the LEDs is aligned to a surface of the dielectric layer. The dielectric layer includes a plurality of openings to expose a portion of the redistribution layer. The circuits are disposed in the openings, and extend to the surface of the dielectric layer to connect the active surface of each of the LEDs.

According to an embodiment of the disclosure, the LEDs are located on the first circuit structure, and the active devices and the second circuit structure are located on a same plane.

According to an embodiment of the disclosure, each of the LEDs includes an active surface and a back surface opposite to each other, and the active surface is located between the back surface and the redistribution layer.

According to an embodiment of the disclosure, the LED package structure further includes a dielectric layer and a surface treatment layer. The dielectric layer is disposed on the redistribution layer, wherein the dielectric layer includes a plurality of openings to expose a portion of the redistribution layer. The surface treatment layer is disposed in the openings, and directly contacts the redistribution layer.

According to an embodiment of the disclosure, each of the LEDs includes an active surface and a back surface opposite to each other, and the back surface is located between the active surface and the redistribution layer.

According to an embodiment of the disclosure, the LED package structure further includes a dielectric layer and a plurality of circuits. The dielectric layer is disposed on the redistribution layer, and covers the LEDs. The active surface of each of the LEDs is aligned to a surface of the dielectric layer. The dielectric layer includes a plurality of openings to expose a portion of the redistribution layer. The circuits are disposed in the openings, and extend to the surface of the dielectric layer to connect the active surface of each of the LEDs.

According to an embodiment of the disclosure, the LED package structure further includes an optical base material provided on a top surface of the molding compound.

Based on the above, according to the LED package structure and the manufacturing method of the LED package structure according to the embodiments of the disclosure, the LEDs are transferred onto the redistribution layer electrically connected to the active devices, and the active devices are adapted to drive the LEDs. As such, the issue that electronic devices cannot be soldered on the back surface of a glass substrate is addressed. In addition, since the active devices are employed to drive the LEDs in the embodiments of the disclosure, the LED package structure and the manufacturing method of the LED package structure according to the embodiments of the disclosure render a lower cost in comparison with the conventional art, in which the passive devices are used for driving.

In order to make the aforementioned features and advantages of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 1A to 1I are schematic cross-sectional views illustrating a manufacturing method of a light emitting diode (LED) package structure according to an embodiment of the disclosure.

DESCRIPTION OF THE EMBODIMENTS

Figure 1C:
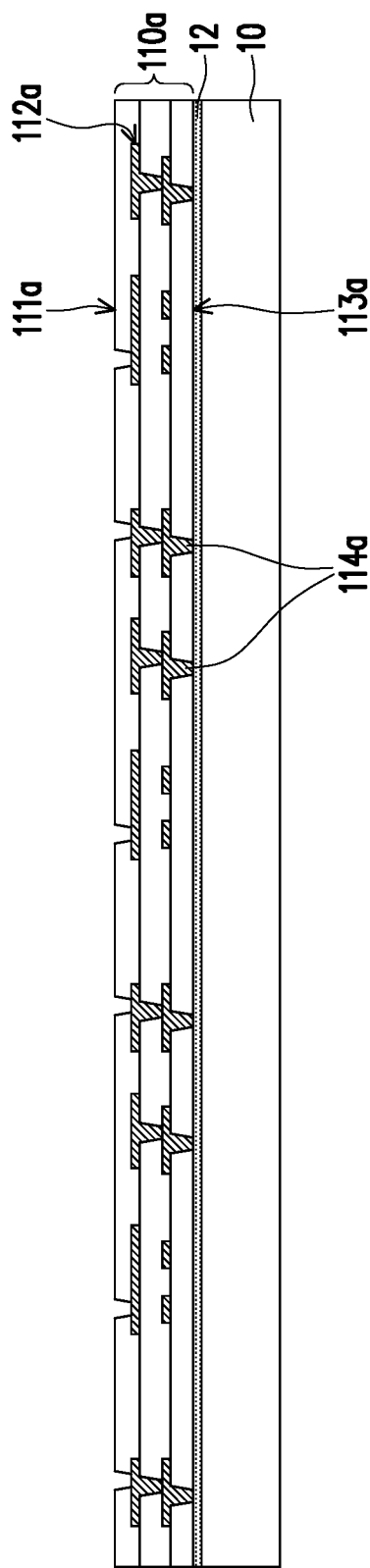

Reference will now be made in detail to the exemplary embodiments of the disclosure, examples of which are illustrated in the accompanying drawings. Wherever possible, the same reference numbers are used in the drawings and the description to refer to the same or like parts.

FIGS. 1A to 1I are schematic cross-sectional views illustrating a manufacturing method of a light emitting diode (LED) package structure according to an embodiment of the disclosure. Regarding the manufacturing method of the LED package structure according to the embodiment, as shown in FIG. 1A, a carrier 10 is provided. Here, the carrier 10 is a glass substrate.

Next, referring to FIG. 1B, a release film 12 is formed on the carrier 10. The release film 12 may be formed by spin coating, for example. However, the disclosure is not limited thereto.

Next, referring to FIG. 1C, a redistribution layer 110a is formed on the carrier 10. The redistribution layer 110a is located on the release film 12 and includes a top surface 111a and a bottom surface 113a opposite to each other as well as a first circuit structure 112a adjacent to the top surface 111a and a second circuit structure 114a adjacent to the bottom surface 113a. The bottom surface 113a is attached to the release film 12 on the carrier 10, and the top surface 111a is located on a side relatively away from the carrier 10. Here, the first circuit structure 112a includes a patterned line layer or a plurality of pads, and the second line structure 114a includes a plurality of conductive vias or a plurality of circuits.

Figure 1D:
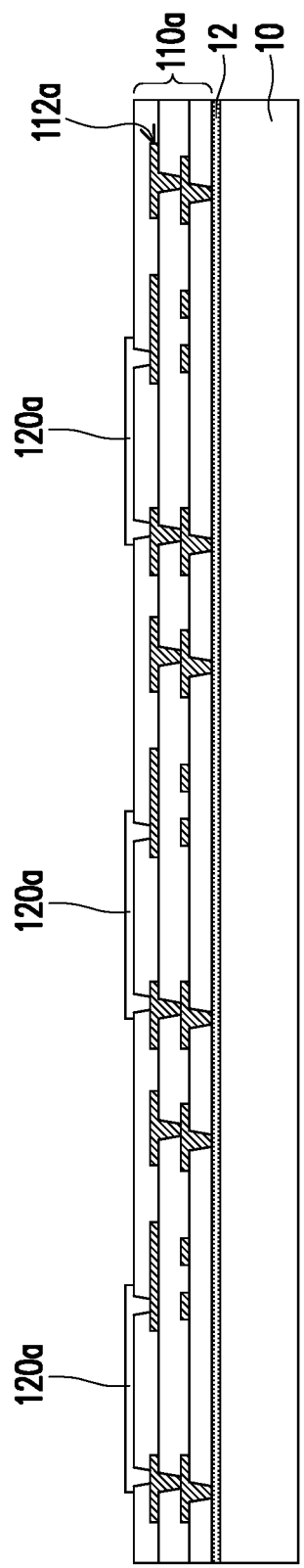

Next, referring to FIG. 1D, a plurality of active devices 120a are formed on the carrier 10. More specifically, the active devices 120a may be thin film transistors (TFTs), for example. However, the disclosure is not limited thereto. The active devices 120a are formed on the side of the redistribution layer 110a relatively away from the carrier 10, and are located on the first circuit structure 112a and electrically connected to the first circuit structure 112a. That is, in the embodiment, the active devices 120a are manufactured on the redistribution layer 110a.

Figure 1E:
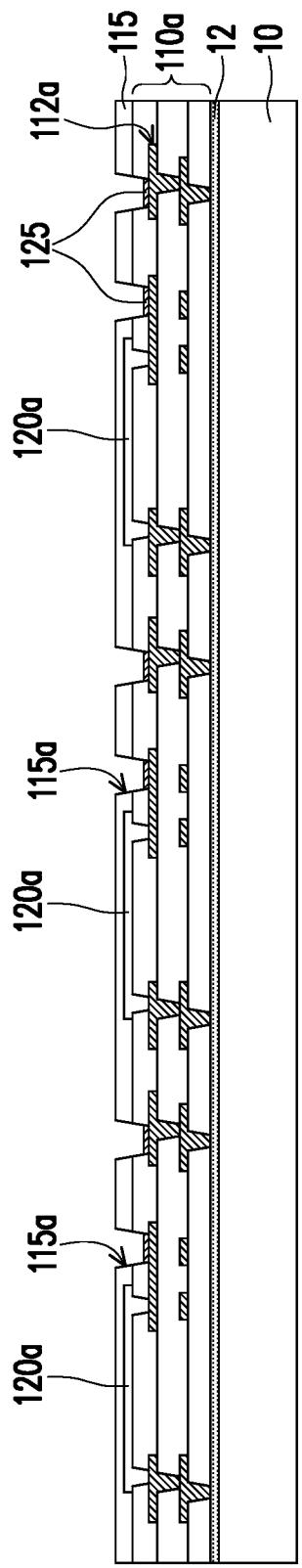

Referring to FIG. 1E, a dielectric layer 115 is formed on the redistribution layer 110a. The dielectric layer 115 covers the active devices 120a, and includes a plurality of openings 115a to expose a portion of the redistribution layer 110a. Here, the openings 115a expose a portion of the first circuit structure 112a of the redistribution layer 110a. Next, a surface treatment layer 125 is formed in the openings 115a of the dielectric layer 115 and directly contacts the redistribution layer 110a. The surface treatment layer 125 is formed on the first circuit structure 112a exposed by the openings 115a of the dielectric layer 115 to protect the first circuit structure 112a from oxidation. Here, the surface treatment layer 125 may be a nickel layer, a gold layer, a silver layer, or a nickel-palladium-gold layer, but is not limited thereto.

Figure 1F:
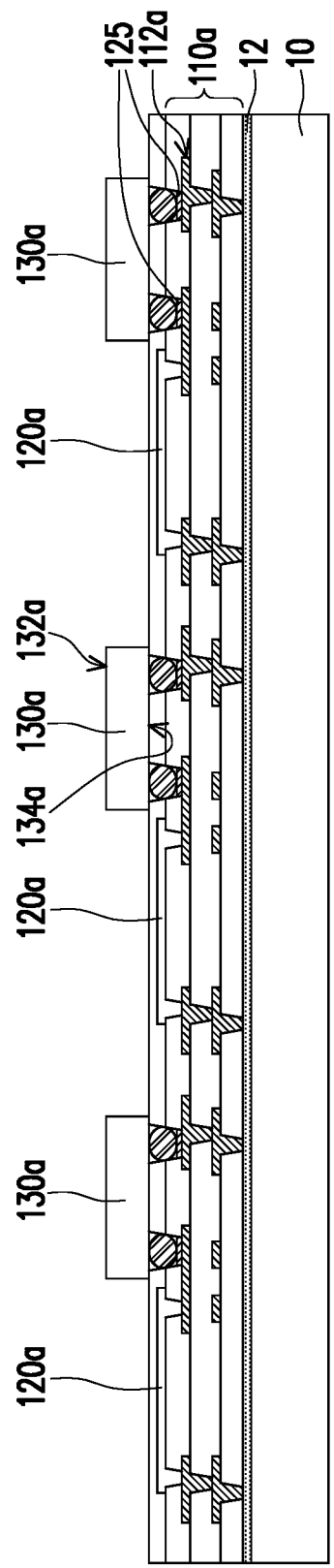

Next, referring to FIG. 1F, a plurality of LEDs 130a are transferred onto the redistribution layer 110a. The LEDs 130a and the active devices 120a are located on the same side of the redistribution layer 110a. More specifically, each of the LEDs 130a includes a back surface 132a and an active surface 134a opposite to each other, and the active surface 134a is located between the back surface 132a and the redistribution layer 110a. That is to say, the LEDs 130a are arranged on the redistribution layer 110a with the active surface 134a facing down. The LEDs 130a are located on the first circuit structure 112a on which the surface treatment layer 125 is arranged. The surface treatment layer 125 is located between the LEDs 130a and the first circuit structure 112a. The LEDs 130a and the active devices 120a are respectively electrically connected to the redistribution layer 110a. The active devices 120a are adapted to respectively drive the LEDs 130a. In particular, the orthographic projections of the LEDs 130a on the carrier 10 do not overlap with the orthographic projections of the active devices 120a on the carrier 10. Here, three LEDs 130a are schematically drawn in FIG. 1F, and, for example, are respectively a red LED, a blue LED and a green LED. However, the disclosure is not limited thereto. According to an exemplary embodiment, the LEDs 130 are micro LEDs.

Figure 1G:
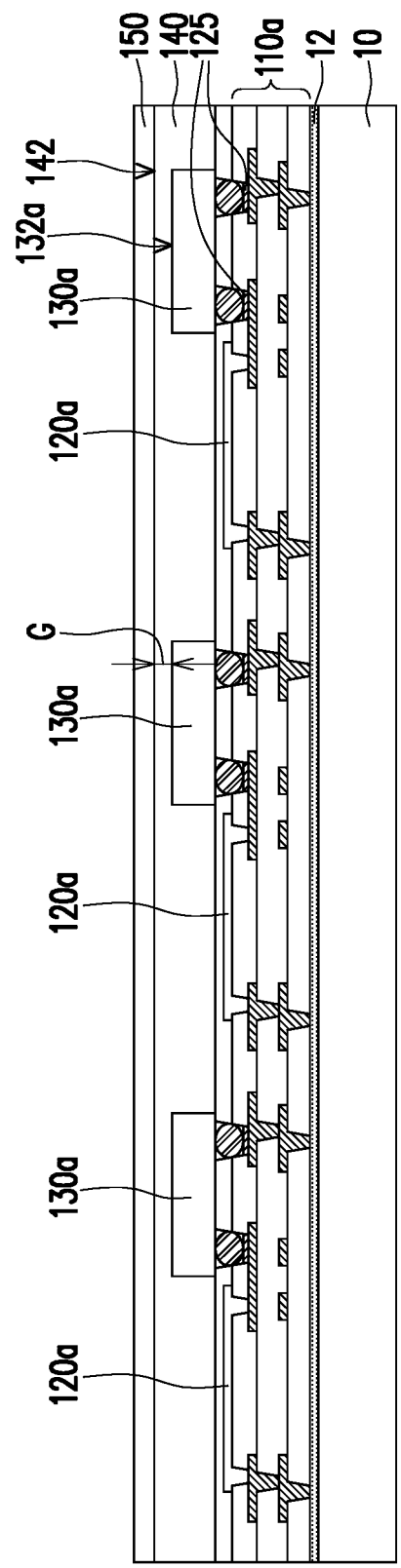

Next, referring to FIG. 1G, a molding compound 140 is formed on the redistribution layer 110a to encapsulate the LEDs 130a. Here, the molding compound 140 covers the back surfaces 132a of the LEDs 130a, and keeps a distance G from the back surfaces 132a for planarization. According to an exemplary embodiment, the molding compound 140 includes silicone and serves to fix the LEDs 130a.

According to FIG. 1G, an optical base material 150 is provided on a top surface 142 of the molding compound 140. The optical base material 150 is capable of rendering favorable optical performance of the light emitted by the LEDs 130a. For example, the optical base material 150 is an optical plate or an optical film. For example, the optical plate may be a light guide plate, and the optical film is a diffuser, a prism or a brightness enhancement film, or an anti-reflection (anti-glare) film. However, the disclosure is not limited thereto.

Figure 1H:
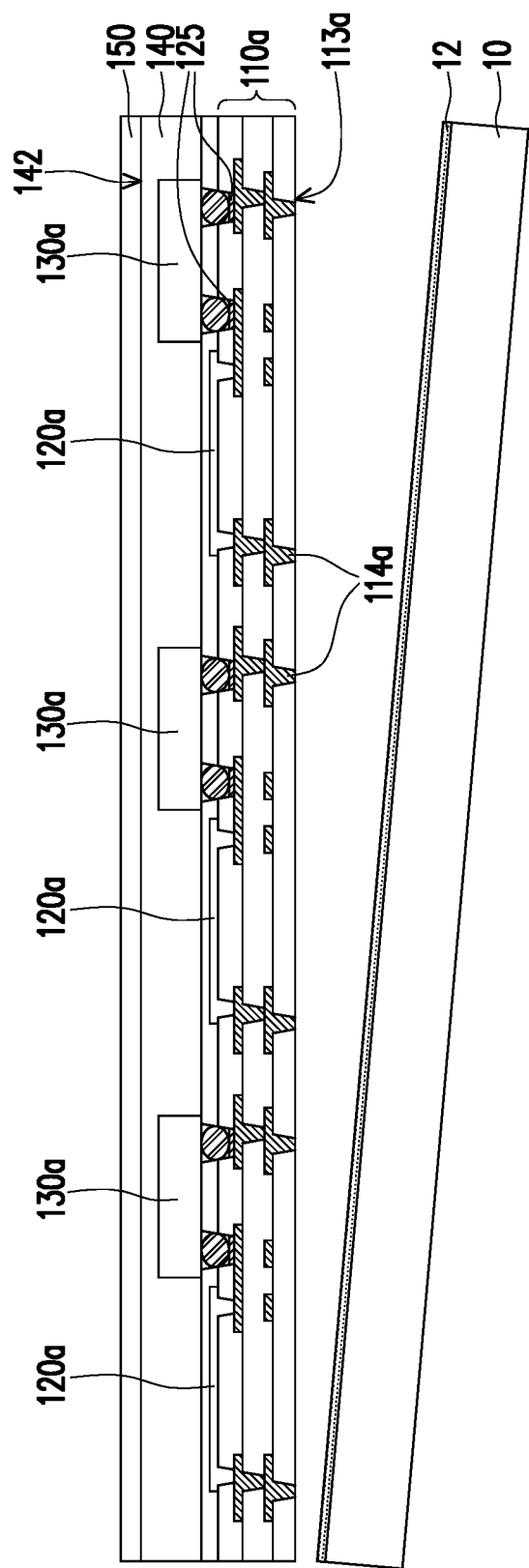
Figure 1I:
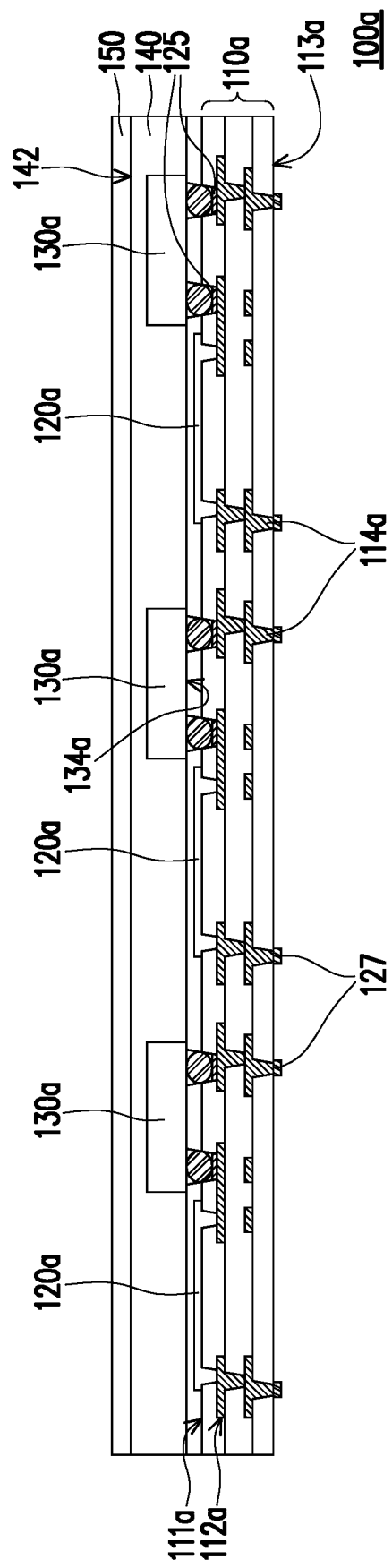

Finally, referring to both FIG. 1H and FIG. 1I, the carrier 10 is removed to expose the bottom surface 113a of the redistribution layer 110a. When the carrier 10 is removed, the release film 12 is peeled off to separate the redistribution 110a and the carrier 10. A surface treatment may be optionally performed on the second circuit structure 114a of the redistribution layer 110a to form a surface treatment layer 127 on the bottom surface 113a of the redistribution layer 110a and thereby protect the second circuit structure 114a. By this time, the manufacturing of the LED package structure 100a has been completed.

Regarding the structure, referring to FIG. 1I, the LED package structure 100a includes the redistribution layer 110a, the active devices 120a, the LEDs 130a and the molding compound 140. The redistribution layer 110a includes the top surface 111a and the bottom surface 113a opposite to each other, and includes the first circuit structure 112a adjacent to the top surface 111a and the second circuit structure 114a adjacent to the bottom surface 113a. The active devices 120a and the LEDs 130a are both disposed on the redistribution layer 110a, and are both electrically connected to the redistribution layer 110a. The active devices 120a are adapted to respectively drive the LEDs 130a. More specifically, the active devices 120a and the LEDs 130a are located on the first circuit structure 112a. For planarization, the molding compound 140 is disposed on the redistribution layer 110a to encapsulate the LEDs 130a.

In addition, the LED package structure 100a of the embodiment further includes the surface treatment layers 125 and 127. The surface treatment layer 125 is arranged between the LEDs 130a and the first circuit structure 112a to protect the first circuit structure 112a, and the surface treatment layer 127 is arranged on the bottom surface 113a of the redistribution layer 110a to protect the second circuit structure 114a. According to the embodiment, the LED package structure 100a further includes the optical base material 150 arranged on the top surface 142 of the molding compound 140. For example, the optical base material 150 is an optical plate or an optical film, and is utilized for enhancing the optical performance of the LEDs 130a.

In short, according to the embodiment, after the active devices 120a are first manufactured on the redistribution layer 110a, the LEDs 130a are transferred onto the redistribution layer 110a. Particularly, the LEDs 130a are arranged on the first circuit structure 112a of the redistribution layer 110a with the active surfaces 132a facing down, and the active devices 120a are adapted to drive the LEDs 130a. That is, the LED package structure 100a of the embodiment is implemented to be an active LED package structure. As such, the issue that electronic devices cannot be soldered on the back surface of a glass substrate is addressed. In addition, according to the embodiment, the active devices 120a are employed to drive the LEDs 130a, so the LED package structure 110a and the manufacturing method of the LED package structure 110a render a lower cost in comparison with the conventional art, in which the passive devices are used for driving.

Figure 2:
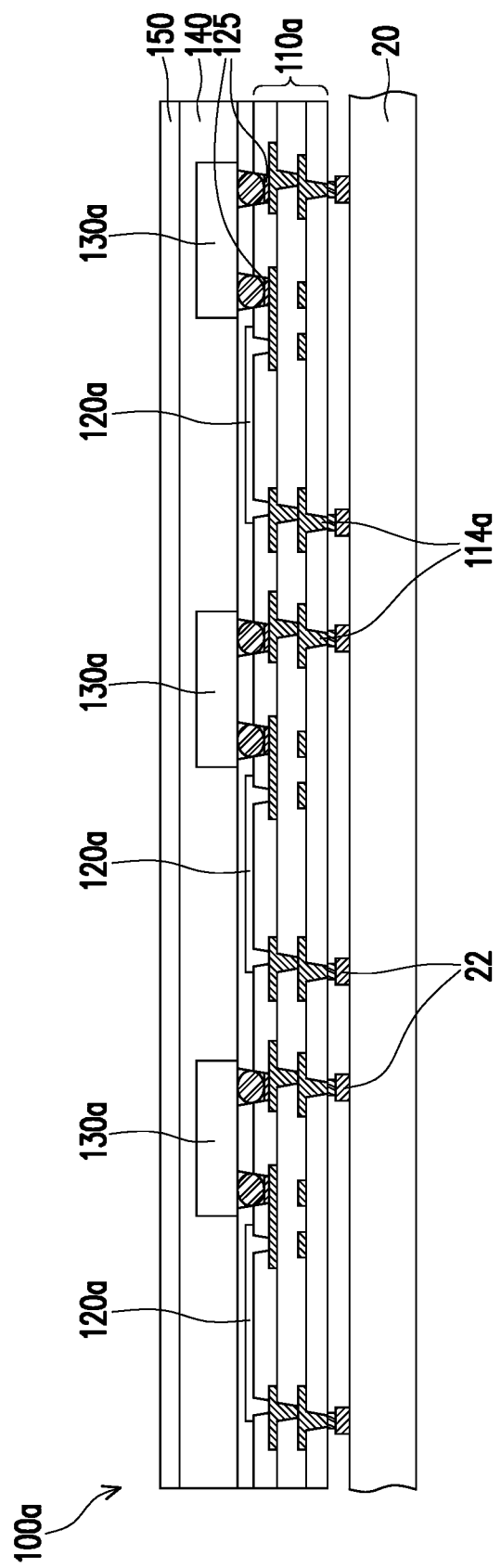
FIG. 2 is a schematic cross-sectional view illustrating the LED package structure of FIG. 1I bonded to a circuit board.

As to the application, referring to FIG. 2, the LED package structure 100a of the embodiment may be bonded to an external circuit 20, so that the second circuit structure 114a of the redistribution layer 110a is electrically connected with pads 22 of the external circuit 20 are electrically connected. Here, the external circuit 20 is a printed circuit board (PCB), for example, but the disclosure is not limited thereto. Also, FIG. 2 merely illustrates one LED package structure 100a bonded to the external circuit 20 for a schematic purpose. If multiple LED package structures 100a are bonded to the external circuit 20 by splicing, a large-scale display can be formed.

In the aforementioned manufacturing method of the LED package structure 110, the redistribution layer 110a is formed on the carrier 10 before the active devices 120a are formed on the carrier 10. However, the disclosure is not limited thereto. In other embodiments, the active devices 120a may also be formed on the carrier 10 before the redistribution layer 110a is formed on the carrier 10.

The following embodiments use the reference numerals and a part of the contents of the above embodiments, and the same reference numerals are used to denote the same or similar elements, while the description of the same technical contents is omitted. For the description of the omitted part, reference may be made to the above embodiments, and details will not be repeated in the following embodiments.

Figure 3A:
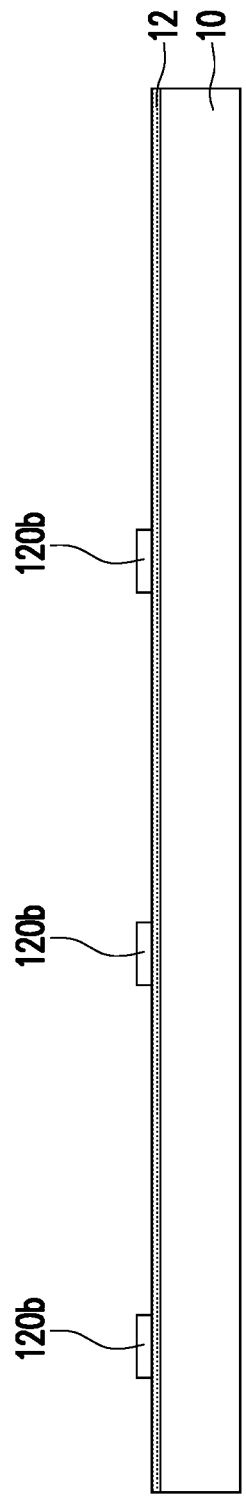
FIGS. 3A to 3G are schematic cross-sectional views illustrating some steps of a manufacturing method of an LED package structure according to an alternative embodiment of the disclosure.

FIGS. 3A to 3G are schematic cross-sectional views illustrating some steps of a manufacturing method of an LED package structure according to an alternative embodiment of the disclosure. The manufacturing method of the LED package structure according to the embodiment is similar to the manufacturing method of the LED package structure described above, but differs in that, after the release film 12 is formed on the carrier 10 as shown in FIG. 1B, active devices 120b are formed on the carrier 10, as shown in FIG. 3A. Specifically, the active devices 120b are located on the release film 12.

Figure 3B:
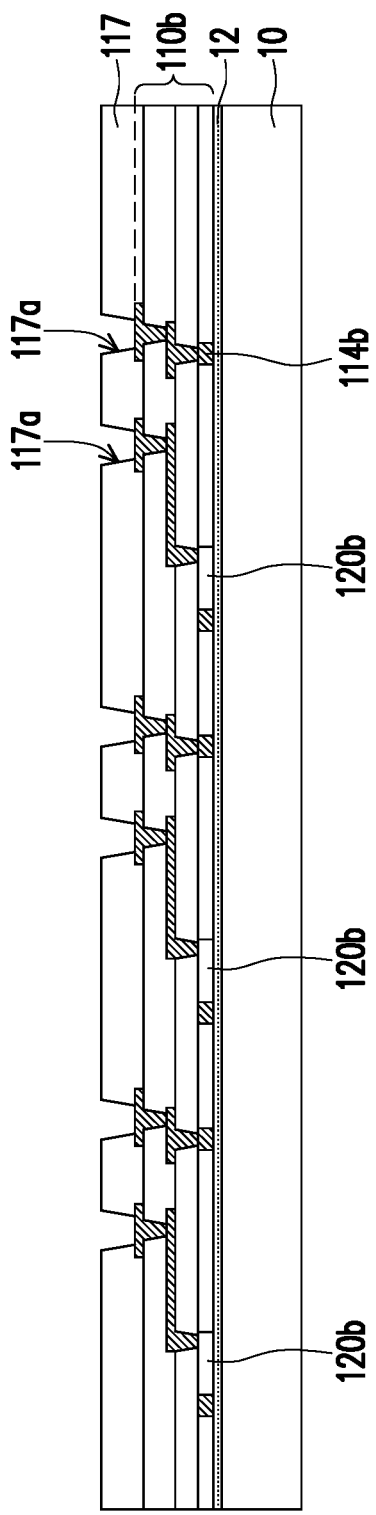

Next, referring to FIG. 3B, a redistribution layer 110b is formed on the carrier 10. The redistribution layer 110b is located on the release film 12. Here, the active devices 120b and a second circuit structure 110b of the redistribution layer 110b are located on the same plane.

Then, referring to FIG. 3B, a dielectric layer 117 is formed on the redistribution layer 110b. The dielectric layer 117 includes a plurality of openings 117a exposing a first circuit structure 112b.

Figure 3C:
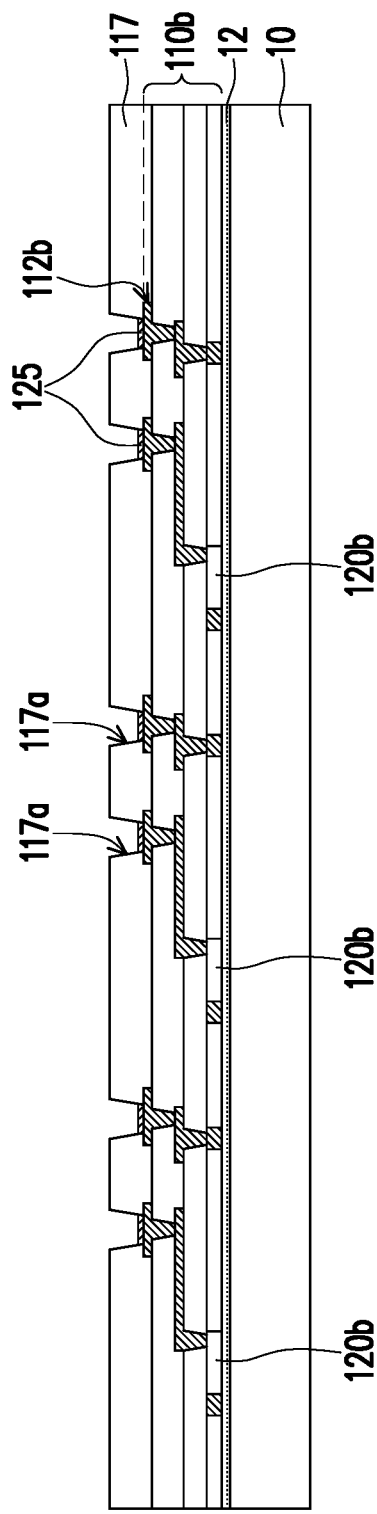

Next, referring to FIG. 3C, the surface treatment layer 125 is formed in the openings 117a of the dielectric layer 117, and directly contacts the first circuit structure 112b of the redistribution layer 110b to protect the first line structure 112b from oxidation.

Figure 3D:
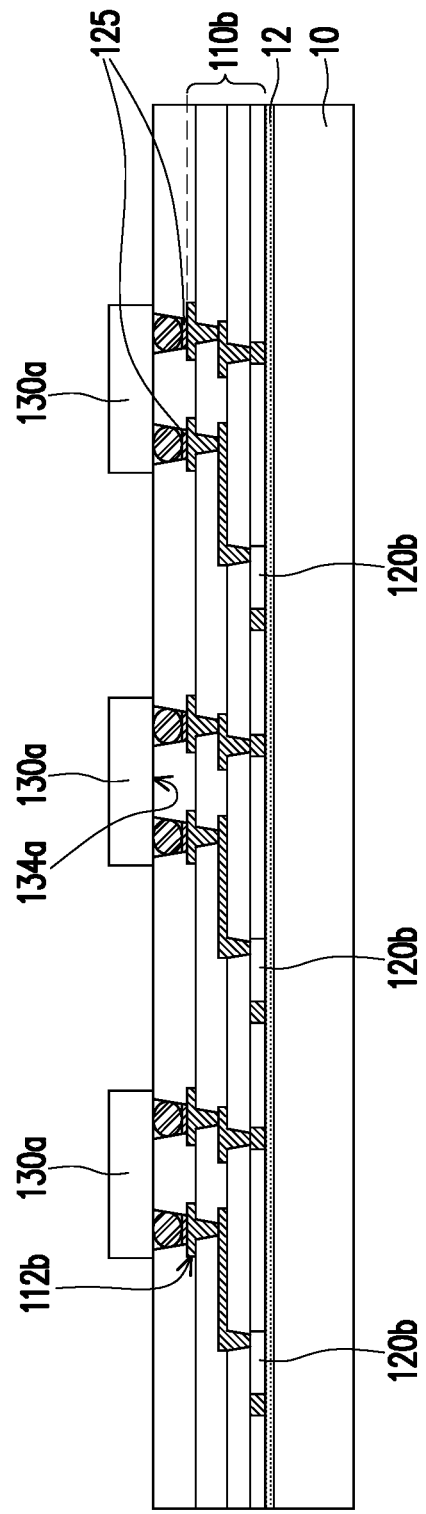

Next, referring to FIG. 3D, the LEDs 130a are transferred onto the redistribution layer 110b. Specifically, the LEDs 130a are arranged on the first circuit structure 112b of the redistribution layer 110b with the active surfaces 134a facing down, and the surface treatment layer 125 is located between the LEDs 130a and the first circuit structure 112b.

Figure 3E:
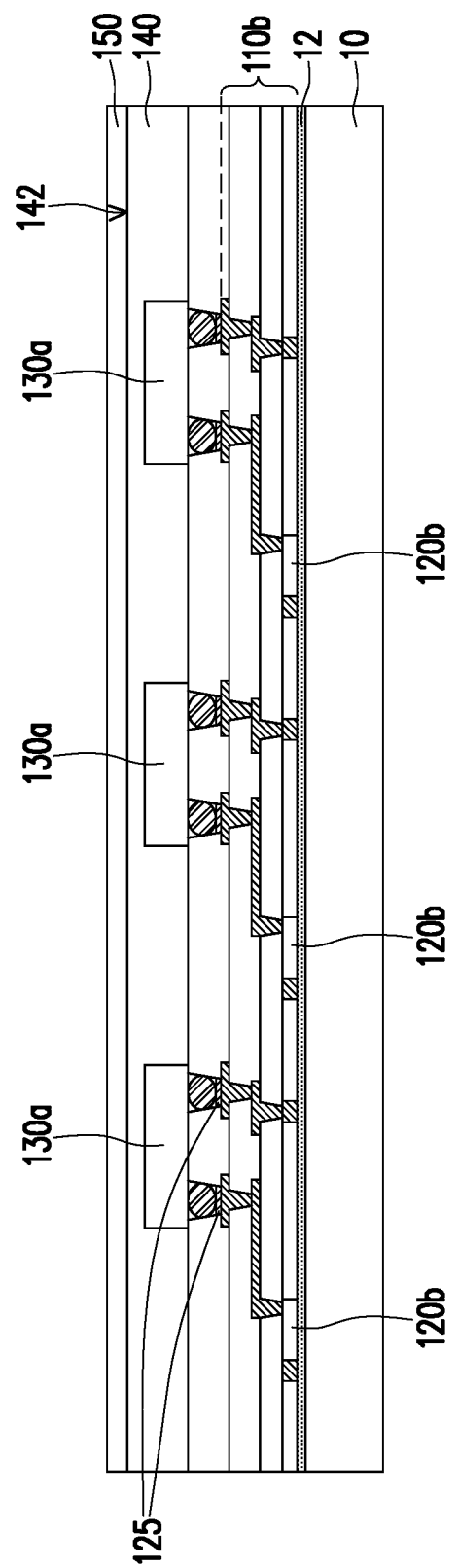

Next, referring to FIG. 3E, the molding compound 140 is formed on the redistribution layer 110b to encapsulate the LEDs 130a. Next, the optical base material 150 is provided on the top surface 142 of the molding compound 140. The optical base material 150, for example, is an optical plate or an optical film.

Figure 3F:
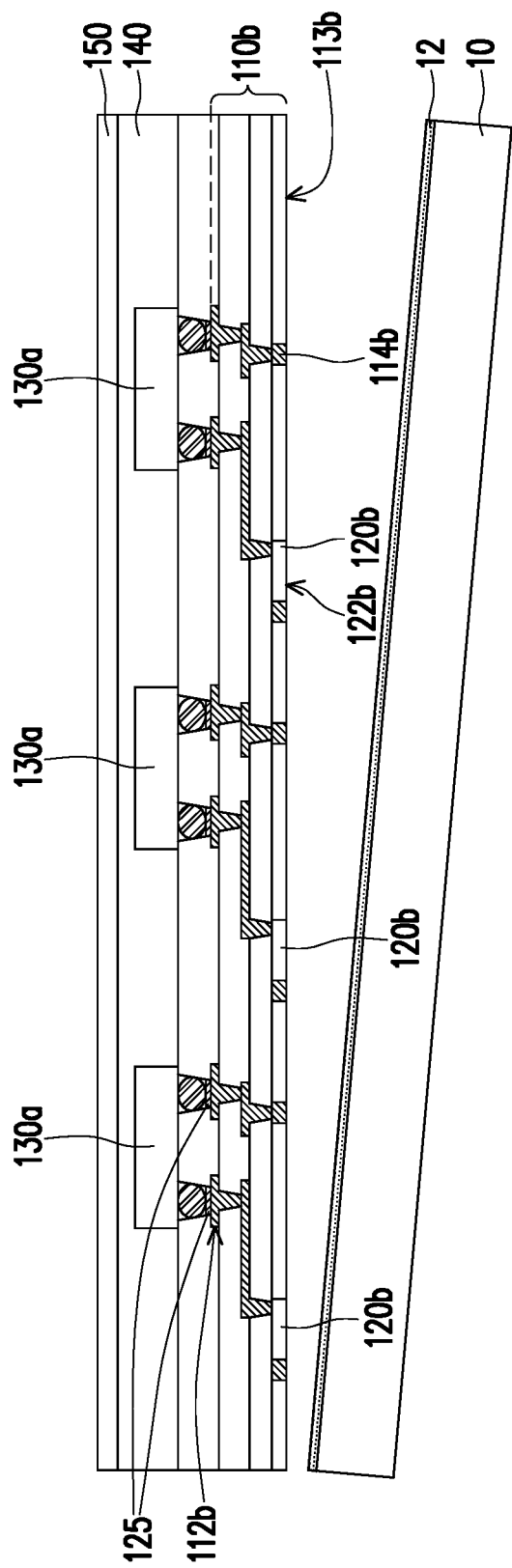
Figure 3G:
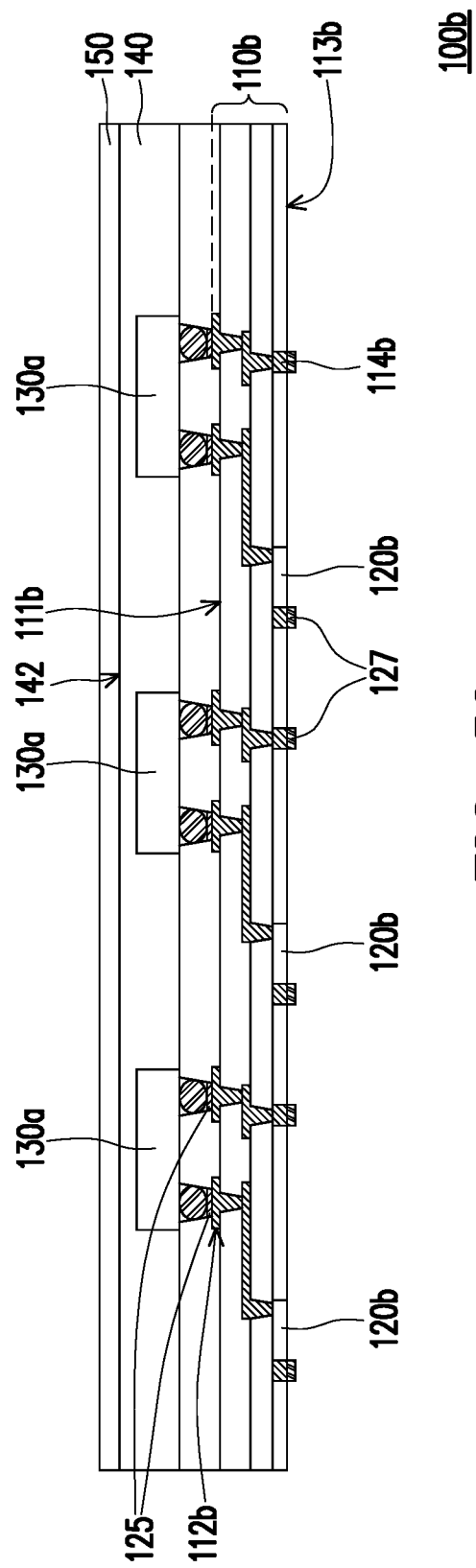

Finally, referring to FIG. 3F and FIG. 3G, the carrier 10 is removed, and the release film 12 is peeled off to expose a bottom surface 113b of the redistribution layer 110b and surfaces 122b of the active devices 120b. A surface treatment may be optionally performed on the second circuit structure 114b of the redistribution layer 110b to form the surface treatment layer 127 on the bottom surface 113b of the redistribution layer 110b and thereby protect the second circuit structure 114b. By this time, the manufacturing of the LED package structure 100b has been completed.

Regarding the structure, referring to FIG. 3G, the LED package structure 100b includes the redistribution layer 110b, the active devices 120b, the LEDs 130a and the molding compound 140. The redistribution layer 110b includes a top surface 111b and the bottom surface 113b opposite to each other, and includes the first circuit structure 112b adjacent to the top surface 111b and the second line structure 114b adjacent to the bottom surface 113b. The active devices 120b and the second circuit structure 114b are located on the same plane, and the LEDs 130a are located on the first circuit structure 112b. The active devices 120b and the LEDs 130a are respectively electrically connected to the redistribution layer 110b. The active devices 120b are adapted to respectively drive the LEDs 130a. The molding compound 140 is disposed on the redistribution layer 110b to encapsulate the LEDs 130a for planarization.

In addition, the LED package structure 100b of the embodiment further includes the surface treatment layers 125 and 127. The surface treatment layer 125 is arranged between the LEDs 130a and the first circuit structure 112b to protect the first circuit structure 112b, and the surface treatment layer 127 is arranged on the bottom surface 113b of the redistribution layer 110b to protect the second circuit structure 114b. The LED package structure 100b of the embodiment further includes the optical base material 150 arranged on the top surface 142 of the molding compound 140. For example, the optical base material 150 is an optical plate or an optical film, and is utilized for enhancing the optical performance of the LEDs 130a.

In short, according to the embodiment, after the active devices 120b are first manufactured, the redistribution layer 110b electrically connected to the active devices 120b is manufactured, and the LEDs 130a are transferred onto the redistribution layer 110b. Also, the active devices 120b are adapted to drive the LEDs 130a. That is, the LED package structure 100b of the embodiment is implemented to be an active LED package structure. By doing so, the issue that electronic devices cannot be soldered on the back surface of a glass substrate is addressed. In addition, according to the embodiment, the active devices 120b are employed to drive the LEDs 130a, so the LED package structure 110b and the manufacturing method of the LED package structure 110b render a lower cost in comparison with the prior art, in which the passive devices are used for driving.

Figure 4:
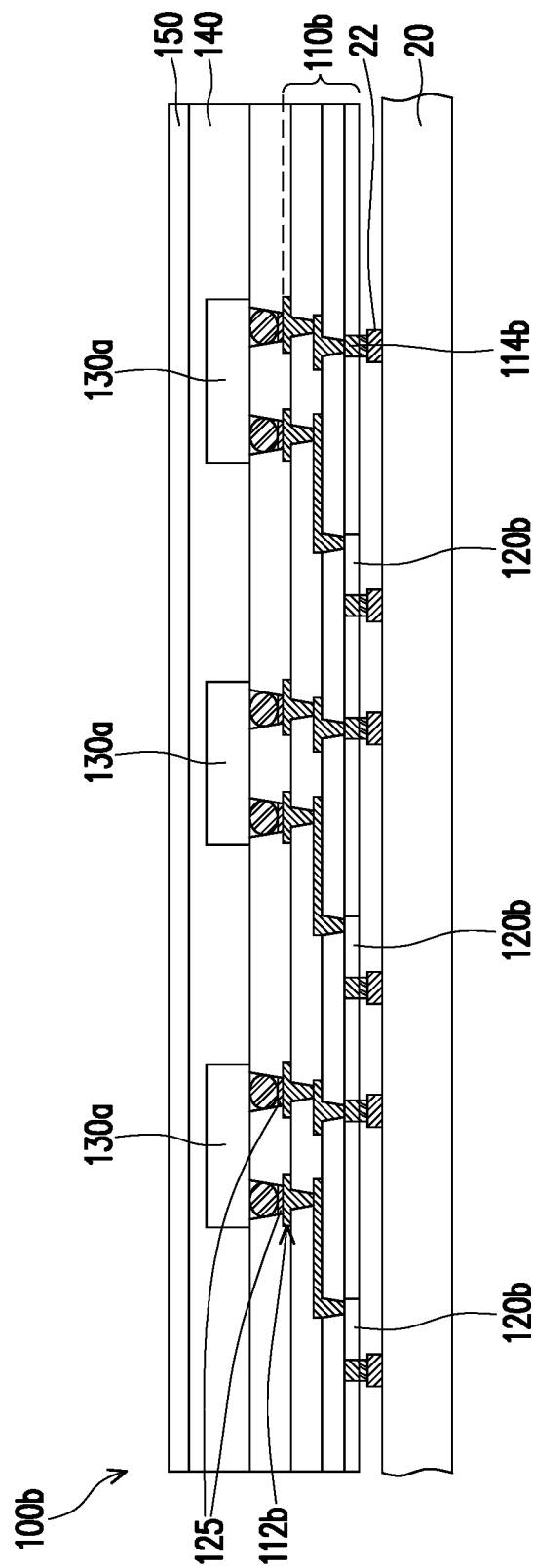
FIG. 4 is a schematic cross-sectional view illustrating the LED package structure of FIG. 3G bonded to a circuit board.

As to the application, referring to FIG. 4, the LED package structure 100b of the embodiment may be bonded to the external circuit 20, so that the second circuit structure 114b of the redistribution layer 110b is electrically connected with the pads 22 of the external circuit 20. FIG. 4 merely illustrates one LED package structure 100b bonded to the external circuit 20 for a schematic purpose. If multiple LED package structures 100b are bonded to the external circuit 20 by splicing, a large-scale display can be formed.

Figure 5A:
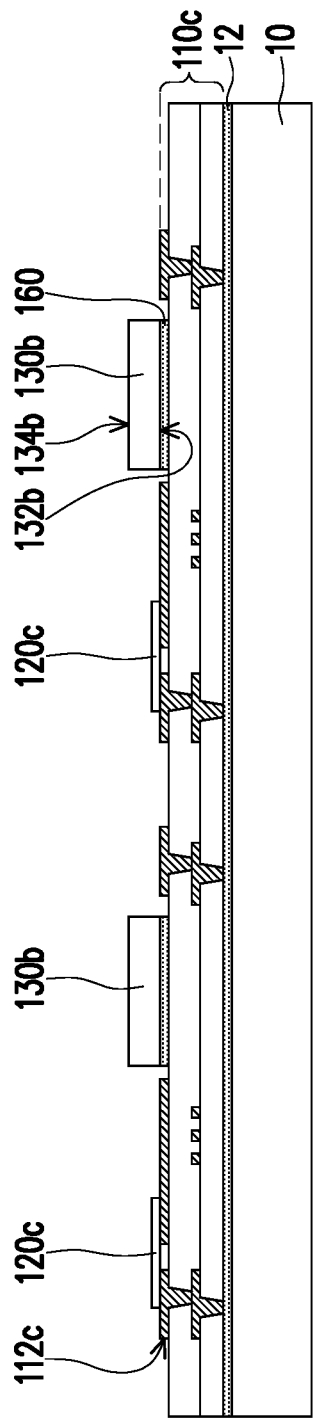
FIGS. 5A to 5E are schematic cross-sectional views illustrating a manufacturing method of an LED package structure and the application thereof according to another embodiment of the disclosure.

FIGS. 5A to 5E are schematic cross-sectional views illustrating a manufacturing method of an LED package structure and the application thereof according to another embodiment of the disclosure. The manufacturing method of the LED package structure of the embodiment is similar to the manufacturing method of the LED package structure 100a, but differs in a step that after the step of FIG. 1D, i.e., after a plurality of active devices 120c are formed on the carrier 10, a plurality of LEDs 130b are transferred onto a redistribution layer 110c, as shown in FIG. 5A. The LEDs 130b and the active devices 120c are located on the same side of the redistribution layer 110c. More specifically, each of the LEDs 130b includes a back surface 132b and an active surface 134b opposite to each other, and the back surface 132b is located between the active surface 134b and the redistribution layer 110c. Note that, the LEDs 130b are arranged with the active surfaces 134b facing up, and are adhered to the redistribution layer 110c through an adhesion layer 160.

Figure 5B:
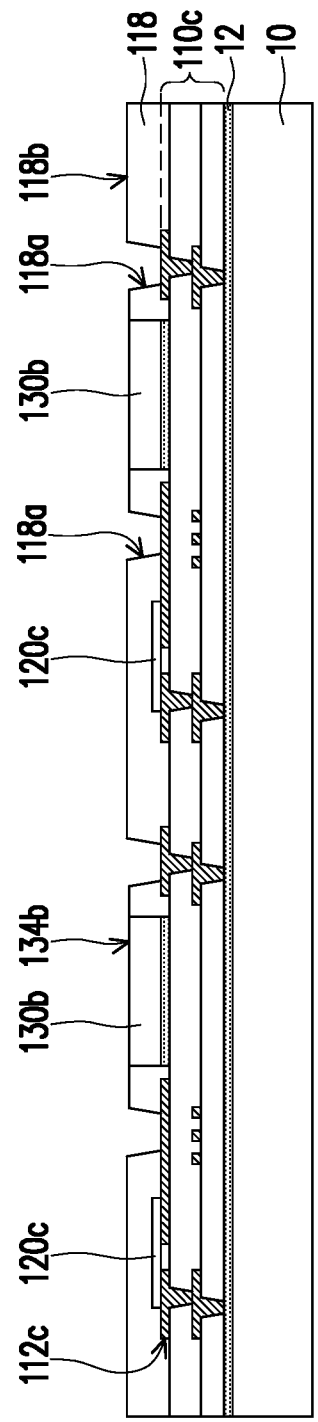

Referring to FIG. 5B, a dielectric layer 118 is formed on the redistribution layer 110c. The dielectric layer 118 covers the active devices 120c and the LEDs 130b. The active surface 134b of each of the LEDs 130b is aligned with a surface 118b of the dielectric layer 118, and the dielectric layer 118 includes a plurality of openings 118a to expose a portion of a first circuit structure 112c of the redistribution layer 110c.

Figure 5C:
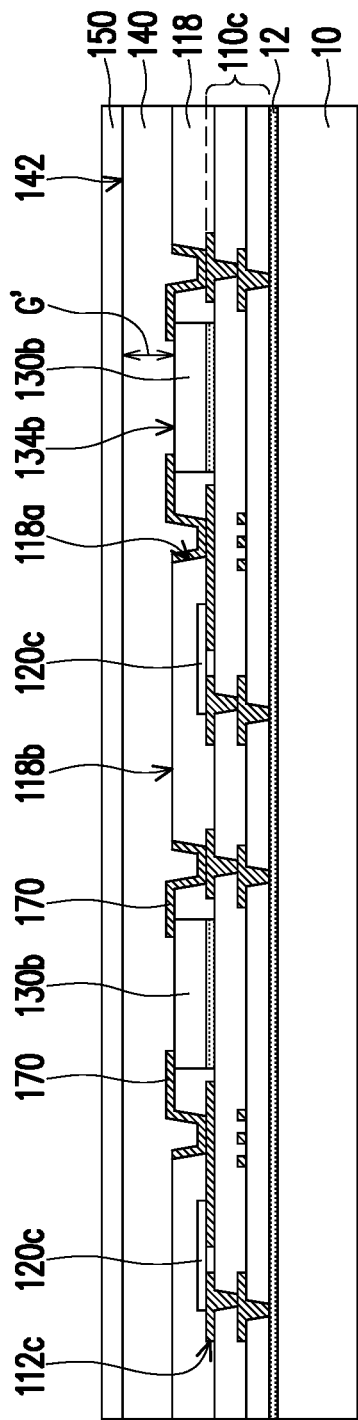

Referring to FIG. 5C, a plurality of circuits 170 are formed in the openings 118a, and extend to the surface 118b of the dielectric layer 118 to connect the active surfaces 134b of the respective LEDs 130b. Next, the molding compound 140 is formed on the redistribution layer 110c to encapsulate the LEDs 130c and the circuits 170. The molding compound 140 covers the active surfaces 134b of the LEDs 130b, and keeps a distance G' from the active surfaces 134b for planarization.

Referring to FIG. 5C, the optical base material 150 is provided on the top surface 142 of the molding compound 140. The optical base material 150 may serve for the LEDs 130b to render favorable optical performance. The optical base material 150 is, for example, is an optical plate or an optical film.

Figure 5D:
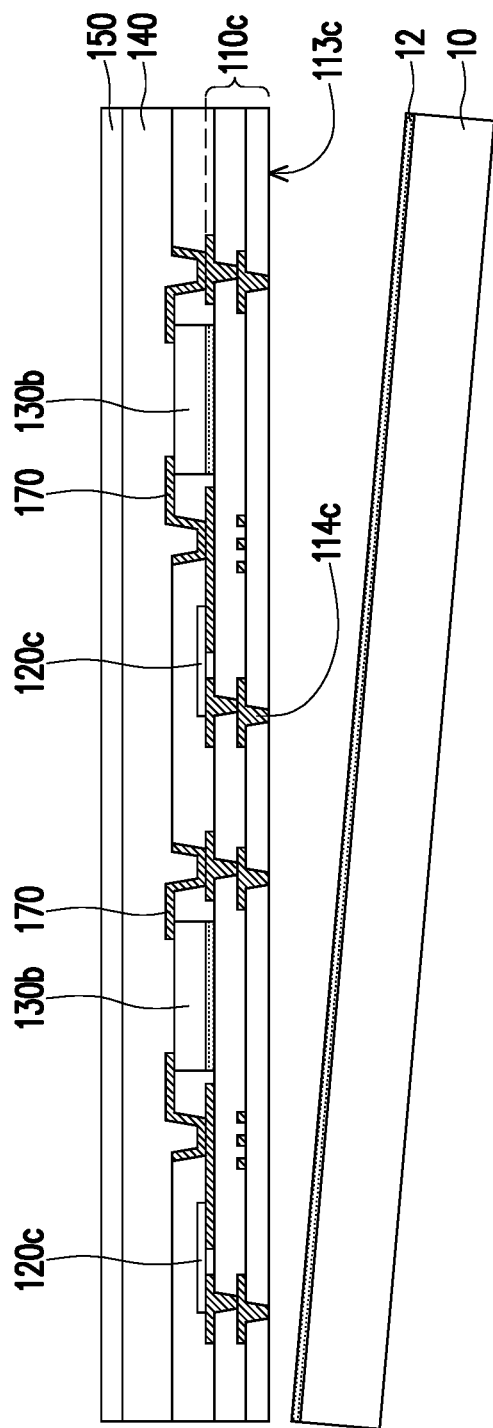
Figure 5E:
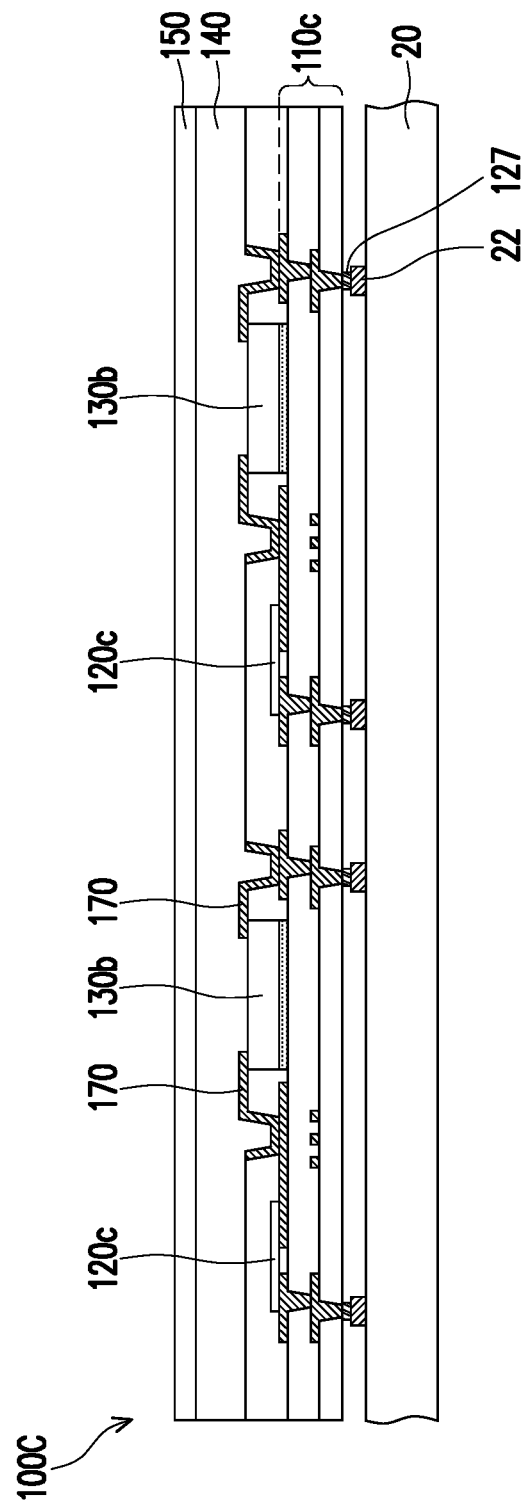

Referring to FIG. 5D and FIG. 5E, the carrier 10 is removed to expose a bottom surface 113c of the redistribution layer 110c. When the carrier 10 is removed, the release film 12 is peeled off to separate the redistribution layer 110c and the carrier 10. A surface treatment may be optionally performed on a second circuit structure 114c of the redistribution layer 110c to form the surface treatment layer 127 on the bottom surface 113c of the redistribution layer 110c and thereby protect the second line structure 114c. By this time, the manufacturing of the LED package structure 100c has been completed.

As to the application, referring to FIG. 5E, the LED package structure 100c of the embodiment may be bonded to the external circuit 20, so that the second circuit structure 114c of the redistribution layer 110c is electrically connected with the pads 22 of the external circuit 20. Here, the external circuit 20 is the PCB, for example, but the disclosure is not limited thereto. FIG. 5E merely illustrates one LED package structure 100c bonded to the external circuit 20 for a schematic purpose. If multiple LED package structures 100c are bonded to the external circuit 20 by splicing, a large-scale display can be formed.

Figure 6A:
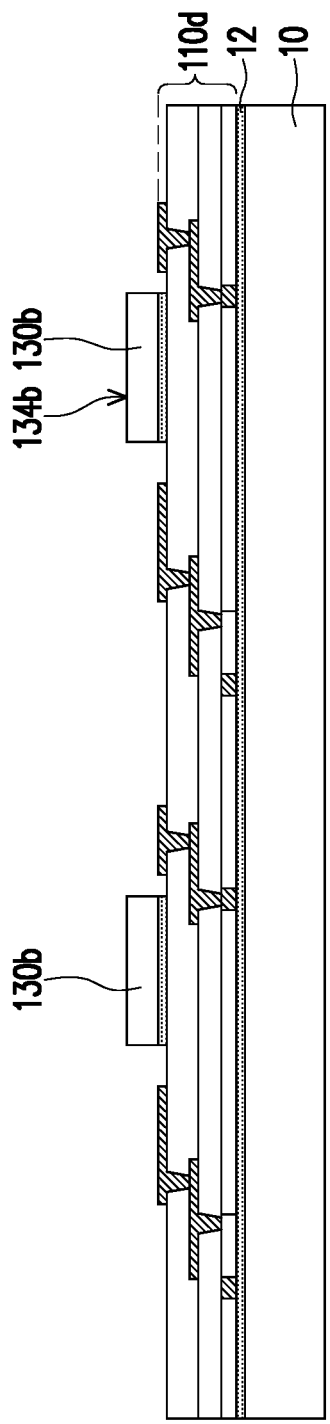
FIGS. 6A to 6E are schematic cross-sectional views illustrating a manufacturing method of an LED package structure and the application thereof according to another embodiment of the disclosure.

FIGS. 6A to 6E are schematic cross-sectional views illustrating a manufacturing method of an LED package structure and the application thereof according to another embodiment of the disclosure. The manufacturing method of the LED package structure of the embodiment is similar to the manufacturing method of the LED package structure 100b described in the above, but differs in that after the step of FIG. 3B, i.e. after a redistribution layer 110d is formed on the carrier 10, the LEDs 130b are transferred onto the redistribution layer 110d, as shown in FIG. 6A. The LEDs 130b are located on the redistribution layer 110d with the active surfaces 134 facing up.

Figure 6B:
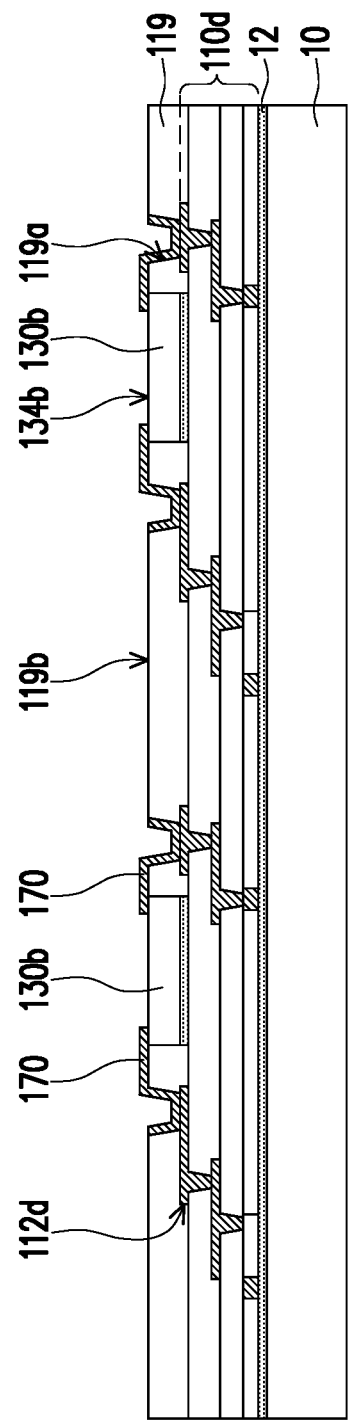

Next, referring to FIG. 6B, a dielectric layer 119 is formed on the redistribution layer 110d. The dielectric layer 119 includes a plurality of openings 119a which expose a first circuit structure 112d. Next, the circuits 170 are formed in the openings 119a, and extend to a surface 119b of the dielectric layer 119 to connect the active surfaces 134b of the respective LEDs 130b.

Figure 6C:
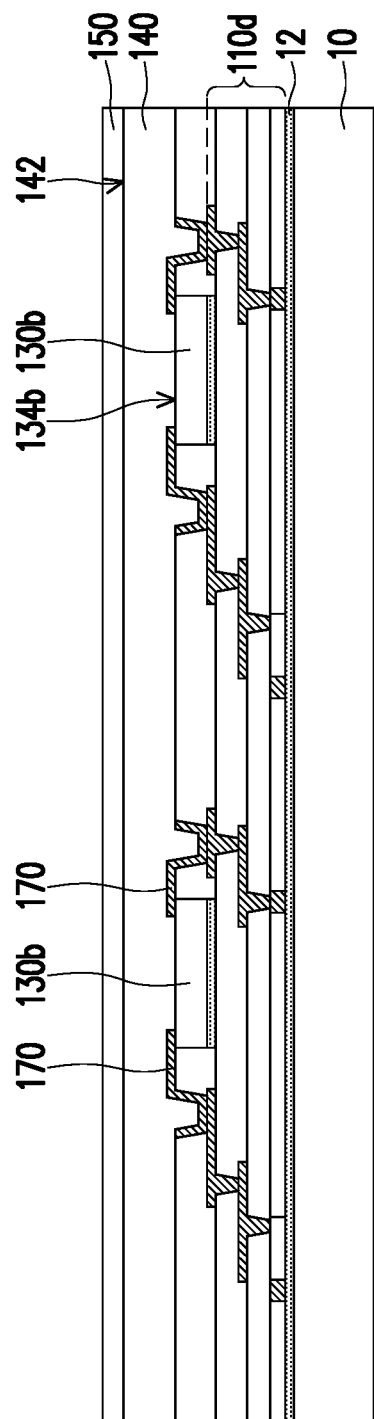

Next, referring to FIG. 6C, the molding compound 140 is formed on the redistribution layer 110d to encapsulate the LEDs 130d and the circuits 170. Here, the molding compound 140 covers the active surfaces 134b of the LEDs 130b.

According to FIG. 6C, the optical base material 150 is provided on the top surface 142 of the molding compound 140. Here, the optical base material 150 allows the light emitted by the LEDs 130b to render favorable optical performance. The optical base material 150 may be an optical plate or an optical film, for example.

Figure 6D:
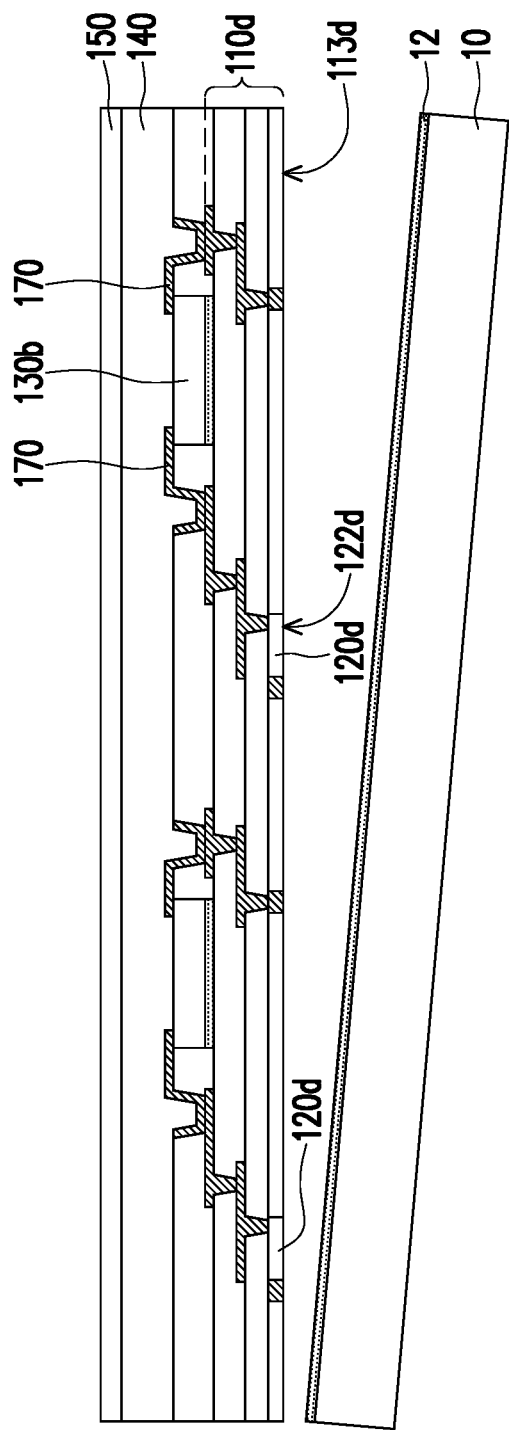
Figure 6E:
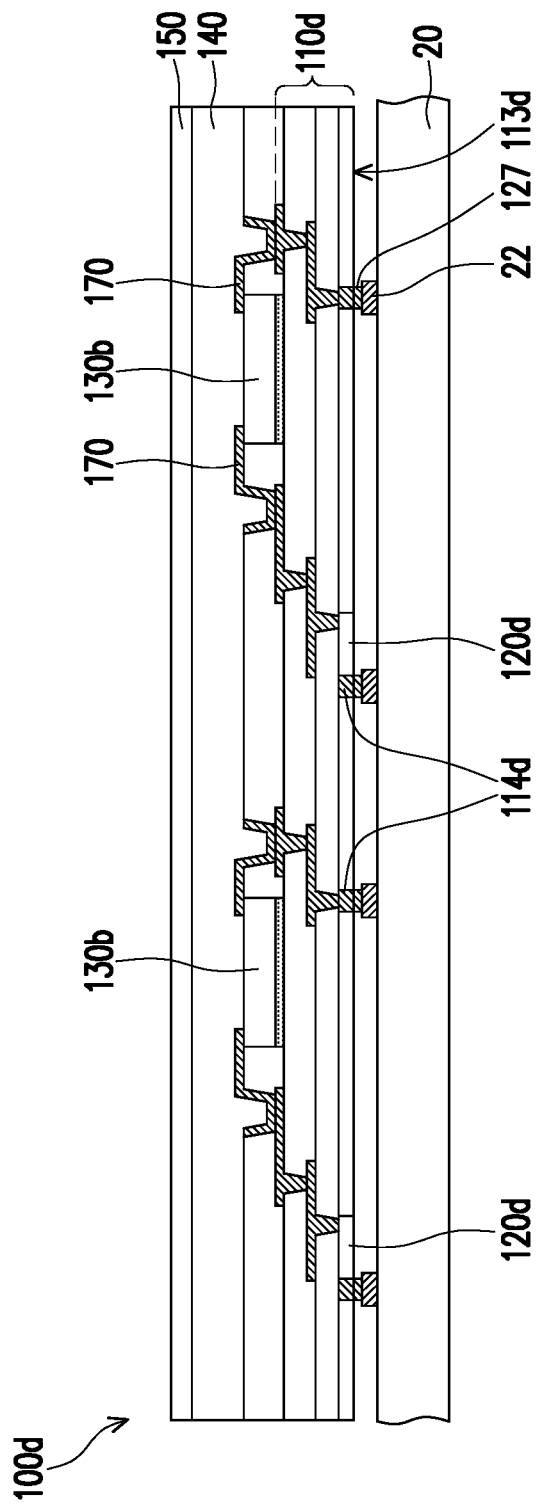

Finally, referring to FIG. 6D and FIG. 6E, the carrier 10 is removed, and the release film 12 is peeled off to expose a bottom surface 113d of the redistribution layer 110d and surfaces 122d of the active devices 120d. A surface treatment may be optionally performed on a second circuit structure 114d of the redistribution layer 110d to form the surface treatment layer 127 on the bottom surface 113d of the redistribution layer 110d and thereby protect the second circuit structure 114d. By this time, the manufacturing of the LED package structure 100d has been completed.

As to the application, referring to FIG. 6E, the LED package structure 100d of the embodiment is bonded to the external circuit 20, so that the second circuit structure 114d of the redistribution layer 110d is electrically connected with the pads 22 of the external circuit 20. FIG. 6E merely illustrates one LED package structure 100d bonded to the external circuit 20 for a schematic purpose. If multiple LED package structures 100d are bonded to the external circuit 20 by splicing, a large-scale display can be formed.

Based on the above, according to the LED package structure and the manufacturing method of the LED package structure according to the embodiments of the disclosure, the LEDs are transferred onto the redistribution layer electrically connected to the active devices, and the active devices are adapted to drive the LEDs. As such, the issue that electronic devices cannot be soldered on the back surface of a glass substrate is addressed. In addition, since the active devices are employed to drive the LEDs in the embodiments of the disclosure, the LED package structure and the manufacturing method of the LED package structure according to the embodiments of the disclosure render a lower cost in comparison with the conventional art, in which the passive devices are used for driving.

It will be apparent to those skilled in the art that various modifications and variations can be made to the structure of the disclosure without departing from the scope or spirit of the disclosure. In view of the foregoing, it is intended that the disclosure cover modifications and variations of the disclosure provided they fall within the scope of the following claims and their equivalents.

What is claimed is:

1. A manufacturing method of a light emitting diode (LED) package structure comprising:
   providing a carrier;
   forming a redistribution layer on the carrier;
   forming a plurality of active devices on the carrier;
   forming a dielectric layer on the redistribution layer, wherein the dielectric layer encloses the plurality of active devices;
   transferring a plurality of light emitting diodes onto the redistribution layer, wherein the light emitting diodes and the active devices are respectively electrically connected to the redistribution layer, and the plurality of active devices are adapted to respectively drive the plurality of light emitting diodes;
   forming a molding compound on the redistribution layer to encapsulate the plurality of light emitting diodes, wherein the dielectric layer is in direct contact with the molding compound; and
   removing the carrier to expose a bottom surface of the redistribution layer.

2. The manufacturing method of claim 1, wherein the redistribution layer is formed on the carrier before the plurality of active devices are formed on the carrier.

3. The manufacturing method of claim 2, wherein the carrier comprises a release film, the redistribution layer is located on the release film, and the release film is peeled off when the carrier is removed to separate the redistribution layer and the carrier.

4. The manufacturing method of claim 3, wherein the plurality of active devices and the plurality of light emitting diodes are located on a side of the redistribution layer relatively away from the carrier.

5. The manufacturing method of claim 4, wherein each of the plurality of light emitting diodes comprises an active surface and a back surface opposite to each other, and the active surface is located between the back surface and the redistribution layer.

6. The manufacturing method of claim 5, wherein:
   the dielectric layer is formed before transferring the plurality of light emitting diodes onto the redistribution layer, and the dielectric layer comprises a plurality of openings to expose a portion of the redistribution layer; and
   the manufacturing method further comprises foil ling a surface treatment layer in the plurality of openings, wherein the surface treatment layer directly contacts the redistribution layer.

7. The manufacturing method of claim 4, wherein each of the plurality of light emitting diodes comprises an active surface and a back surface opposite to each other, and the back surface is located between the active surface and the redistribution layer.

8. The manufacturing method of claim 7, wherein:
   the dielectric layer is formed before forming the molding compound on the redistribution layer, the dielectric layer covers the plurality of active devices and the plurality of light emitting diodes, the active surface of each of the plurality of light emitting diodes is aligned to a surface of the dielectric layer, and the dielectric layer comprises a plurality of openings to expose a portion of the redistribution layer; and
   the manufacturing method further comprises forming a plurality of circuits in the plurality of openings, wherein the plurality of circuits extend to the surface of the dielectric layer to connect the active surface of each of the plurality of light emitting diodes.

9. The manufacturing method of claim 1, wherein the plurality of active devices are formed on the carrier before the redistribution layer is formed on the carrier.

10. The manufacturing method of claim 9, wherein the carrier comprises a release film, and the plurality of active devices and the redistribution layer are located on the release film.

11. The manufacturing method of claim 10, wherein the release film is peeled off when the carrier is removed to expose the bottom surface of the redistribution layer and surfaces of the plurality of active devices.

12. The manufacturing method of claim 9, wherein each of the plurality of light emitting diodes comprises an active surface and a back surface opposite to each other, and the active surface is located between the back surface and the redistribution layer.

13. The manufacturing method of claim 12 further comprising:
   before transferring the plurality of light emitting diodes on the redistribution layer, forming a dielectric layer on the redistribution layer, wherein the dielectric layer comprises a plurality of openings to expose a portion of the redistribution layer; and
   forming a surface treatment layer in the plurality of openings, wherein the surface treatment layer directly contacts the redistribution layer.

14. The manufacturing method of claim 9, wherein each of the plurality of light emitting diodes comprises an active surface and a back surface opposite to each other, and the back surface is located between the active surface and the redistribution layer.

15. The manufacturing method of claim 14 further comprising:
   before forming the molding compound on the redistribution layer, forming a dielectric layer on the redistribution layer, wherein the dielectric layer covers the plurality of light emitting diodes, the active surface of each of the plurality of light emitting diodes is aligned to a surface of the dielectric layer, and the dielectric layer comprises a plurality of openings to expose a portion of the redistribution layer; and
   forming a plurality of circuits in the plurality of openings, wherein the plurality of circuits extend to the surface of the dielectric layer to connect the active surface of each of the plurality of light emitting diodes.

16. The manufacturing method of claim 1 further comprising:

after forming the molding compound on the redistribution layer and before removing the carrier, providing an optical base material on a top surface of the molding compound.

17. The manufacturing method of claim 1 further comprising:
after removing the carrier to expose the bottom surface of the redistribution layer, forming a surface treatment layer on the bottom surface of the redistribution layer.

* * * * *